(12) United States Patent
O'Malley et al.

(10) Patent No.: US 7,475,734 B2
(45) Date of Patent: Jan. 13, 2009

(54) DOWNHOLE WET CONNECT USING PIEZOELECTRIC CONTACTS

(75) Inventors: Edward J. O'Malley, Houston, TX (US); Steve Rosenblatt, Houston, TX (US)

(73) Assignee: Baker Hughes Incorporated, Houston, TX (US)

( * ) Notice: Subject to any disclaimer, the term of this patent is extended or adjusted under 35 U.S.C. 154(b) by 116 days.

(21) Appl. No.: 11/584,740

(22) Filed: Oct. 20, 2006

(65) Prior Publication Data

US 2008/0093069 A1   Apr. 24, 2008

(51) Int. Cl.
 *E21B 17/02* (2006.01)
 *E21B 47/16* (2006.01)
(52) U.S. Cl. ............... 166/380; 166/378; 166/65.1; 166/242.6
(58) Field of Classification Search ................. 166/380, 166/378, 65.1, 242.6
See application file for complete search history.

(56) References Cited

U.S. PATENT DOCUMENTS

| | | | |
|---|---|---|---|
| 5,141,051 A | 8/1992 | Lenhart | |
| 5,389,003 A | 2/1995 | Van Steenwyk et al. | |
| 5,967,816 A | 10/1999 | Sampa et al. | |
| 6,439,932 B1 | 8/2002 | Ripolone | |
| 6,504,258 B2 * | 1/2003 | Schultz et al. | 290/1 R |
| 6,776,636 B1 | 8/2004 | Cameron et al. | |
| 6,866,306 B2 * | 3/2005 | Boyle et al. | 285/333 |
| 6,957,574 B2 * | 10/2005 | Ogle | 73/152.48 |
| 7,291,028 B2 * | 11/2007 | Hall et al. | 439/194 |
| 2006/0260804 A1 * | 11/2006 | O'Malley | 166/249 |
| 2007/0010119 A1 * | 1/2007 | Hall et al. | 439/310 |

* cited by examiner

*Primary Examiner*—Shane Bomar
(74) *Attorney, Agent, or Firm*—Steve Rosenblatt

(57) ABSTRACT

A downhole wet connect uses a bearing relation between materials to take advantage of the piezoelectric effect between them. Voltage is applied from the surface to the uphole pad which induces a voltage to be generated from the downhole pad to a storage device to store power for operating downhole equipment. The generated voltage can also be used as a real time power supply for downhole equipment. Alternatively, the generated voltage can be coded as a signal to downhole equipment to send date acquired downhole to the surface. The transmission of information is two way. Voltage input from the surface is stopped as downhole equipment sends a voltage based signal uphole for conversion by surface processors to capture the data. Alignment or downhole debris issues do not affect the transmission capability of the pads in the wet connect.

17 Claims, 1 Drawing Sheet

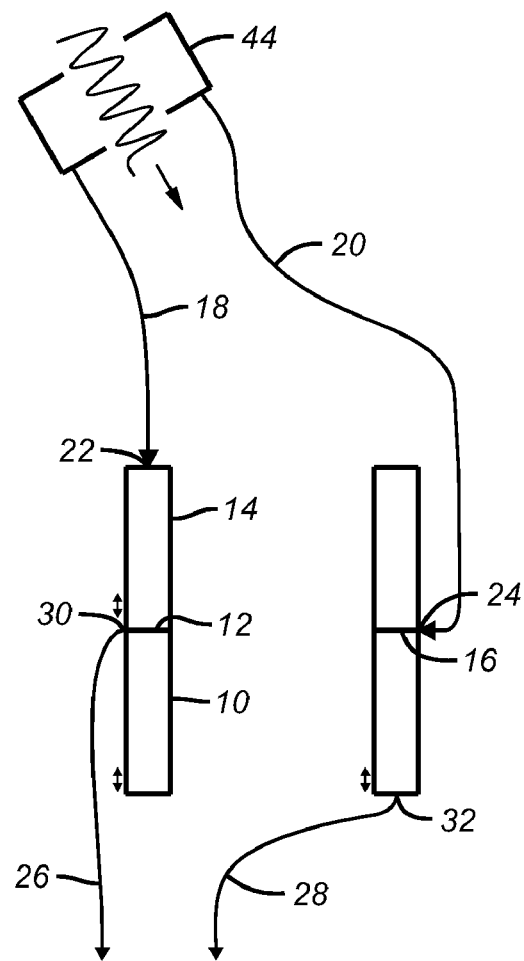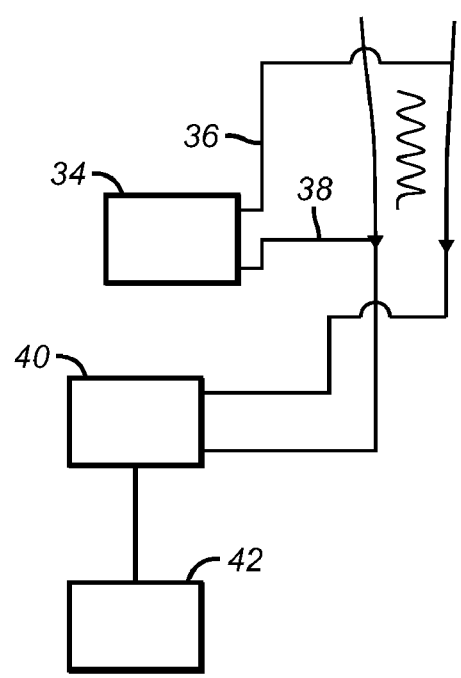

DOWNHOLE WET CONNECT USING PIEZOELECTRIC CONTACTS

FIELD OF THE INVENTION

The field of the invention is downhole wet connections for power and signal transmission lines from downhole to the surface.

BACKGROUND OF THE INVENTION

Frequently in downhole operation a lower completion is installed and an upper completion is run into it and connections are made downhole. Apart from the main tubular segments being connected there are frequently auxiliary lines that run parallel to the main tubing that also need to be connected with the main tubular that supports them. These auxiliary lines can be hydraulic, pneumatic, signal or power transmission lines to name a few. Fiber optic cables are also run in control lines, sometimes by pumping the cable down one conduit and returning the cable to the surface by making a u-turn in the auxiliary line near the bottom of the completion.

The connection downhole for the main tubular and the auxiliary lines it supports is frequently referred to as a wet connect. Some of the issues that affect wet connects are the need to get the components aligned before they are moved together for completing the connection. This is normally accomplished with a v-shaped guide path on one half of the connection that a lug on the other half of the connection runs into so that relative rotation is created as the lug finds an elongated longitudinal portion of the track that the v-shaped portion converges into for the needed alignment. Alignment is typically less critical for tubular hydraulic auxiliary lines but is more significant an issue for power or signal lines where making a good wire to wire contact is important for proper circuit operation or power transmission. Also a concern is the effect of downhole fluids on the ability of mating wires to make good contact. While seals can be used to isolate well fluids once the joint is made up, the issues arise when the yet connected coupling halves are still spaced apart and have not yet fully come together. Different designs for such connections have been proposed but have yet to effectively deal with physical requirements of alignment or the environmental issues that can prevent effective contact for wires or fiber optics that are brought together downhole in a wet connect. Some examples of previous designs are U.S. Pat. Nos. 6,776,636; 6,439,932; 5,967,816; 5,389,003 and 5,141,051.

The present invention seeks to overcome some of the issues affecting the prior design so as to improve the functionality of wet connections for power or signal transmission. The invention employs concepts of piezoelectric transformers and uses suitable materials that exhibit this property as the mating pair in a wet connect for cable or signal lines. The materials, such as certain ceramics are positioned in each half of the wet connect so that when the upper portion of the wet connect is run in from the surface, it will have a bearing relation to its counterpart in the lower portion of the wet connect. A voltage can be applied from the surface to the upper ceramic at an appropriate frequency which is converted into a force that acts on the lower ceramic on which it bears. Depending on the relative dimensions of the ceramics, the lower ceramic emits either the same or an elevated or reduced voltage. This concept underlies the performance of piezoelectric transformers. In the downhole application, the generated voltage goes to operate downhole equipment and any excess can go to a storage device. Alternatively, by coding the voltage being transmitted such as by using predetermined patterns of voltage variation, signals are sensed from the surface by a downhole processor that in turn can control downhole sensors or other equipment to support the needed activity downhole. Conversely, input from the surface can be interrupted so that a downhole processor can transmit a predetermined pattern of voltage that goes to the surface where a surface processor can decode the information obtained downhole and store and display it. One big advantage to this is that intimate contact between the ceramics is not required. They simply need a bearing relationship to each other in an orientation related to the way the ceramics were polled when they were manufactured.

A brief background citing materials, applications and the theoretical basis of operation of piezoelectric materials used as transformers follows. A somewhat arcane and little-known technology that relies on the piezoelectric effect is adding a welcome design alternative to the art of generating high voltages. The idea of a piezoelectric "transformer" is not a new one, but the complicated nature of the design, which requires some knowledge of electronics, mechanics, and materials, has taken 43 years to get right. The advantages of piezoelectric transformers are many: small size, no windings and thus no short-circuit capability between the windings, and the ability to generate a wide range of high-voltage ac or dc outputs. One immediate application of these transformers is for generating the high voltage that's necessary to run the cold-cathode fluorescent lamp of an LCD.

Piezoelectric transformers are not transformers. They have no wires or magnetic fields. A better analogy is that they are dynamos. The piezoelectric transformer works like a motor that is mechanically coupled to a generator. Understanding this concept requires a basic understanding of piezoelectricity.

Many materials, such as quartz, lithium niobate, and lead-zirconate-lead-titanate (PZT) exhibit some form of the piezoelectric effect. The piezoelectric transformer uses PZT, hence, it is a PZT transformer. Two piezoelectric effects exist: the direct effect and the inverse effect. With the direct effect, placing a force or vibration (stress) on the piezoelectric element generates a charge. The polarity of this charge depends on the orientation of the stress compared with the direction of polarization in the piezoelectric element. During the manufacturing process, poling, or applying a high dc field in the range of 45 kV/cm to the PZT transformer, sets the polarization direction.

The inverse piezoelectric effect is, as the name implies, the opposite of the direct effect. Applying an electric field, or voltage, to the piezoelectric element results in a dimensional change, or strain. The direction of the change is likewise linked to the polarization direction. Applying a field at the same polarity of the element results in a dimensional increase, and fields of opposite polarity result in a decrease. An increase in one dimension in a structure results in a decrease in the other two through Poisson's coupling, or the fact that lateral strain results in longitudinal strain at Poisson's ratio. This phenomenon is a factor in the operation of the transformer.

The piezoelectric transformer uses both the direct and inverse effects to create high-voltage step-up ratios. A sine-wave voltage drives the input portion of the transformer, which causes it to vibrate. This operation is the inverse, or motor, effect. The vibration couples through the structure to the output to generate an output voltage, which is the direct, or generator, effect.

The piezoelectric transformer is constructed of PZT ceramic, but more precisely it is a multilayer ceramic. The manufacturing of the transformer is similar to the manufacturing of ceramic chip capacitors. The process prints layers of flexible, unfired PZT-ceramic tape with metallic patterns, then aligns and stacks the layers to form the required structure. The next step involves pressing, dicing, and firing the stacks to create the final ceramic device.

The input section of the transformer has a multilayer ceramic-capacitor structure. The pattern of the metal electrodes creates an interdigitated plate configuration. The output section of the transformer has no electrode plates between the ceramic layers, so firing produces a single ceramic output structure. Conductive material, which forms the output electrode for the transformer, coats the end of the output section.

The next construction step establishes the polarization directions for the two halves of the transformer. Poling of the input section across the interdigitated electrodes results in a polarization direction that aligns vertically to the thickness. Poling of the output section creates a horizontal or length-oriented polarization direction. Operating the transformer drives the input in thickness mode, which means that an applied voltage between the parallel plates of the input causes the input section to become thicker and thinner on alternate halves of the sine wave. The change in input thickness couples through to the output section, causing it to lengthen and shorten and thereby generating the output voltage. The resulting voltage step-up ratio is proportional to the ratio of the output length and the thickness of the input layers.

The equivalent circuit model for the piezoelectric transformer looks identical to that of its series-resonant magnetic counterpart. The differences, however, extend past the nominal values to the physical representation of the various components. The input and output capacitances are simply the result of having a dielectric between two metal plates. The effective dielectric constant of PZT material is 400 to 5000, depending on composition. At this point, unfortunately, basic electronics ends. The rest of the components are more complicated. The inductance is the mass of the transformer. The capacitance is the compliance of the material, or the inverse of spring rate. Calculating the compliance requires using the applicable generalized beam equation and Young's modulus, which is a constant that expresses the ratio of unit stress to unit deformation. The resistor represents the combination of dielectric loss and the mechanical Q of the transformer.

The acoustic, as opposed to the electrical, resonant frequency is related to the product of the capacitance and inductance. The transformer operates in length resonance, and the associated motions are identical to those of a vibrating string. The major difference between a PZT transformer and a vibrating string is that the PZT transformer's frequencies are in the ultrasonic range and vary, by design, from 50 kHz to 2 MHz. Like the string, the transformer has displacement nodes and antinodes. Mechanically clamping a node prevents vibration, which reduces efficiency in the best case and prevents operation in the worst.

The final element in the model is the "ideal" transformer with ratio N. This transformer represents three separate transformations. The first is the transformation of electrical energy into mechanical vibration. This transformation is a function of the piezoelectric constant, which is the electric field divided by stress, the stress area, and the electric-field length. The second transformation is the transfer of the mechanical energy from the input section to the output section and is a function of Poisson's ratio, or the ratio of lateral to longitudinal strain, for the material. The final transformation is the transfer of mechanical energy back into electrical energy, and the calculations are similar to those for the input side.

Resonant magnetic high-voltage transformers have an electrical Q of 20 to 30. The equivalent for the piezoelectric transformer is its mechanical Q, which exceeds 1500. This high Q is both good and bad. The ultimate efficiency can be very high, but the usable bandwidth of the transformer is only 2.5% that of the magnetic type. The resonant frequency depends on the compliance of the material, which, in turn, is a function of Young's modulus. An unusual property of piezoelectric materials is that Young's modulus changes with electrical load. In most, if not all, cases, the shift in resonant frequency over rated load is greater than the usable bandwidth. Thus, the piezoelectric transformer must operate at resonance to maintain efficiency and stability. The near-resonance designs for magnetic transformers work poorly, if at all, with piezoelectric transformers. Having tracking oscillators is a requirement.

With the above background and general explanation of the execution of the present invention, those skilled in the art will appreciate its full scope from a detailed description of a specific downhole application described below as read with the associated drawings while recognizing that the full scope of the invention is to be found in the claims.

SUMMARY OF THE INVENTION

A downhole wet connect uses a bearing relation between materials to take advantage of the piezoelectric effect between them. Voltage is applied from the surface to the uphole pad which induces a voltage to be generated from the downhole pad to a storage device to store power for operating downhole equipment. The generated voltage can also be used as a real time power supply for downhole equipment. Alternatively, the generated voltage can be coded as a signal to downhole equipment to send data acquired downhole to the surface. The transmission of information is two way. Voltage input from the surface is stopped as downhole equipment sends a voltage based signal uphole for conversion by surface processors to capture the data. Alignment or downhole debris issues do not affect the transmission capability of the pads in the wet connect.

BRIEF DESCRIPTION OF THE DRAWING

The FIGURE is a schematic section view of a made up downhole wet connect using a bearing relationship of ring shaped piezoelectric materials.

DETAILED DESCRIPTION OF THE PREFERRED EMBODIMENT

The FIGURE illustrates a ring shaped lower component 10 made from a material that exhibits a piezoelectric effect. It is secured in the lower completion that is not shown but is supported in the well. The lower pan of a downhole wet connect, also not shown, lends support to ring 10 leaving its tipper face 12 exposed. The upper completion not shown, supports an upper ring 14 with a lower face 16 that is dimensionally similar to upper face 12. When the wet connect is made up the faces 12 and 16 are in a bearing relation to each other. They may be in actual contact or they may be coupled via other solid members between the rings. Well fluid and or particles from the well fluid in between the components of the wet connect can also act as a means of force transmission. Literal physical contact is not mandatory for operation of the invention. Absolute alignment of face 12 and 16 is not critical either as it might be prior designs where power or signals are being transmitted across a wet connect on wires. While end alignment of ring shapes is illustrated those skilled in the art will appreciate that other shapes and alignments are possible. The rings 10 and 14 can wind up nested and beveled so that a normal component of load from one to the other exists. In general, for optimum operation, the components should have a bearing relation to each other when the wet connect is assembled and the direction of the principal bearing force should be in alignment with the poling direction for the two components used. As described above, the poling direction is established in the manufacturing process for the piezoelectric materials used. Once again, a bearing relationship can occur with or without direct physical contact between the piezoelectric materials.

Ring 14 is connected by wires 18 and 20 to surface equipment, not shown. Wires 18 and 20 go to opposed terminals 22 and 24 whose locations are determined by the poling process during manufacturing. Similarly, ring 10 has wires 26 and 28 extending from terminals 30 and 32 whose locations are again determined by the poling process during manufacturing. Preferably, terminals 22 and 32 are shouldered against tubing from the surface and the tubular downhole, not shown, that together support the mating portions of a wet connect, not shown. Regardless of orientation, it is preferred that the rings 10 and 14 be in compressive loading when the wet connection of which they are a component is made up. Compressive loading can occur from an abutting relation or from a gap that can be variable such as by movably mounting one or both of the components under a force bias such as a spring, for example. In that event, the compressive loading can be transmitted across the incompressible fluid found in the wellbore or/and solid impurities found in such incompressible fluid. Preferably the line or plane of compressive loading is oriented through the terminals in the direction of poling during manufacturing. While rings 10 and 14 are shown in the FIGURE with similar dimensions such similarities are not required. Similar dimensions have the result of generating an output voltage similar to the input voltage while dissimilar dimensions in the direction of poling can result in a step up or a step down in output voltage as compared to input voltage.

A battery 34 is connected to lines 26 and 28 via lines 36 and 38. Lines 26 and 28 can continue to a processor 40 to power it or to send signals to it or both as will be explained below. Downhole sensors or other downhole tools 42 can be connected through the processor 40 for information to be sent to the processor 40 or to receive power from lines 26 and 28 indirectly through the processor 40 as shown in the FIGURE or by direct connection that bypasses the processor 40 that is not shown.

Operation after rings 10 and 14 have a bearing relationship after the wet connect joint is made up proceeds as follows. An input voltage or sequence of voltages, often around 5 volts at a modulated frequency that tracks a resonant frequency of ring 14 is input from the surface through lines 18 and 20 that extend from the surface to ring 14. That input starts a vibration, in. ring 14 and is transmitted to ring 10 due to the bearing relationship that those rings have when the wet connect that houses them is made up. In turn the vibration input into ring 10 to ring 14 causes ring 10 to emit a voltage at its resonant frequency. If the rings 10 and 14 are dimensionally the same, the voltage input and frequency input to ring 14 will simply be generated from ring 10. A step up or down in the voltage generated from ring 14 is also possible depending, on the relative configurations of the bearing surfaces 12 and 16 of the ring 10 and 14. The associated current can be used to charge the battery or other storage device 34. Alternatively, the voltage can be modulated in a way that the processor 40 processes as a request for specific data or to operate certain downhole equipment. Alternatively, power to operate may be sent down to a downhole sensor or tool such as 42 indirectly as shown in the FIGURE or directly.

If the signal from the surface is to send data, the transmission of voltage from the surface can be optionally interrupted and transmission from the wellbore can be initiated. The processor 40 can send a voltage or sequence of voltages that can be a coded signal when received at the surface at processor 44 for storage, indication or/and further processing at the surface. The downhole processor 40 can send data from downhole sensors, report on position or movement of downhole equipment and otherwise provide data on downhole conditions such as pressure, pH or temperatures to name a few.

Alternatively, rings 10 and 14 can be segmented circumferentially and optionally spaced apart so that additional wire pairs can extend to the surface from each segment of 14 and a like amount can extend down from each segment of 10. In that way, signal or power flow can occur at the same time in opposed directions. This will allow the downhole equipment to be continuously powered from the surface while information on downhole conditions and equipment can be sent in real time to the surface.

While solid or segmented rings on opposed sides of a wet connect have been described, those skilled in the art will appreciate that other shapes with a bearing relation when the wet connect is made up are also contemplated. The pairs can have rectangular, square, trapezoidal or other geometric shapes and they can abut on end or be oriented on a slope and wind up being concentrically disposed when the wet connect is made up.

The piezoelectric materials, such as those mentioned above, when incorporated into a wet connect overcome the problems of prior designs that transmit power or information. Those issues were the need for precise alignment of lines or wires and the effect of downhole impurities on the quality of the connection once the wet connect in this type of service is made up. The present invention makes precise alignment less critical. With nested arrangements of rings, for example, alignment is really not an issue at all. Even using other shapes a coarse alignment will still function well and the actual size of the mating piezoelectric segments can be sized to compensate for some offset in makeup alignment. Additionally, wellbore debris on the contacting surfaces will not degrade the connection quality as the mating segments rely on a bearing relation and do not require intimate physical contact. Apart from these advantages, the wet connect can have a much simpler design. If complete rings are used, there is no need for orienting features for the wet connect coupling halves before complete makeup. Further, there is no need for temporary protection from well debris for the downhole component until the wet connect is later mated up to the uphole component. The functional advantages of electrical and signal wet connects of the past are retained while the reliability of the transmission through such wet connects is greatly increased.

The above description is illustrative of the preferred embodiment and many modifications may be made by those skilled in the art without departing from the invention whose scope is to be determined from the literal and equivalent scope of the claims below.

We claim:

1. A downhole wet connector, comprising:
   an uphole and a downhole component adapted to be made up to each other downhole;
   at least one piezoelectric material in each of said components positioned so that on makeup of said components said piezoelectric materials are positioned for energy transmission between said components trough said piezoelectric materials;
said materials directly or indirectly abut when said components are made up.

2. The connector of claim 1, wherein:
said materials substantially align when said components are made up.

3. The connector of claim 2, wherein:
said materials comprise a predetermined poling direction and said substantial alignment is substantially in said poling direction.

4. The connector of claim 1, wherein:
said materials undergo compressive loading when they abut.

5. The connector of claim 2, wherein:
said materials form a gap in between when said components are made up.

6. The connector of claim 1, wherein:
said components each further comprise at least one line extending therethrough and attached to at least one location on the piezoelectric material.

7. The connector of claim 1, wherein:
at least one of the piezoelectric materials is movably mounted in its respective component.

8. The connector of claim 1, wherein:
said at least one piezoelectric material comprises a plurality of piezoelectric materials in each component so that on makeup energy transmission can go in opposed directions between discrete pairs of piezoelectric materials.

9. The connector of claim 8, wherein:
said piezoelectric materials on each component are spaced apart.

10. The connector of claim 2, wherein:
said alignment is in an axial direction aligned with a centerline through said components.

11. The connector of claim 2, wherein:
said alignment is in a radial direction perpendicular or askew to a centerline through said components.

12. A method of transmitting energy through a downhole wet connect, comprising:

placing at least one piezoelectric material in a downhole component;
running the downhole component into the well;
placing at least one piezoelectric material in an uphole component;
joining said components downhole;
generally aligning the piezoelectric materials from said joining;
directly or indirectly abutting the piezoelectric materials from said joining; and
transmitting energy through said piezoelectric materials in said joined components.

13. The method of claim 12, comprising:
running at least one line from the surface to the piezoelectric material in said uphole component;
running at least one line from the piezoelectric material in said downhole component to a downhole device; and
transmitting power or information between the surface and the downhole device through said lines in at least one direction.

14. The method of claim 12, comprising:
movably mounting at least one of said piezoelectric materials and subjecting it to a bias force toward its aligned counterpart.

15. The method of claim 12, comprising:
subjecting said piezoelectric materials to compressive loading upon said joining regardless of whether said piezoelectric materials are or are not in direct contact.

16. The method of claim 12, comprising:
using a plurality of piezoelectric materials in said uphole and downhole components:
transmitting energy in opposed directions through said joined components at the same time.

17. The method of claim 12, comprising:
aligning pairs of piezoelectric materials along their poling axis;
orienting said poling axis parallel, perpendicular or askew to the longitudinal axis of said joined components.

* * * * *